US012645003B2

(12) United States Patent
Colombo et al.

(10) Patent No.:     US 12,645,003 B2
(45) Date of Patent:         Jun. 2, 2026

(54) METHOD FOR PREDICTING A GEOPHYSICAL MODEL OF A SUBTERRANEAN REGION OF INTEREST

(71) Applicant: SAUDI ARABIAN OIL COMPANY, Dhahran (SA)

(72) Inventors: Daniele Colombo, Dhahran (SA); Diego Rovetta, Delft (NL)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 1119 days.

(21) Appl. No.: 17/692,724

(22) Filed: Mar. 11, 2022

(65) Prior Publication Data

US 2023/0288589 A1     Sep. 14, 2023

(51) Int. Cl.
| | |
|---|---|
| G01V 1/28 | (2006.01) |
| G01V 20/00 | (2024.01) |
| G06F 30/27 | (2020.01) |

(52) U.S. Cl.
CPC .............. G01V 1/282 (2013.01); G01V 20/00 (2024.01); G06F 30/27 (2020.01)

(58) Field of Classification Search
CPC ......... G01V 1/282; G01V 20/00; G06F 30/27
USPC .......................................................... 703/14
See application file for complete search history.

(56) References Cited

U.S. PATENT DOCUMENTS

| | | | |
|---|---|---|---|
| 8,363,509 | B2 | 1/2013 | Colombo et al. |
| 8,861,308 | B2 | 10/2014 | Virgilio et al. |
| 8,923,094 | B2 | 12/2014 | Jing et al. |
| 10,261,215 | B2 | 4/2019 | Miotti et al. |

(Continued)

FOREIGN PATENT DOCUMENTS

| | | |
|---|---|---|
| CN | 109313724 B | 6/2021 |
| EP | 2020609 A1 | 2/2009 |

(Continued)

OTHER PUBLICATIONS

Moss, Adam. "Accelerated Bayesian inference using deep learning." Monthly Notices of the Royal Astronomical Society 496.1 (2020): 328-338. (Year: 2020).*

(Continued)

*Primary Examiner* — John E Johansen
(74) *Attorney, Agent, or Firm* — Osha Bergman Watanabe & Burton LLP

(57)     ABSTRACT

A system and methods are disclosed for determining a model of a subterranean region. The method includes obtaining an observed dataset and a current model for the subterranean region, simulating a dataset from the current model, and determining a data penalty function based on a difference between the observed and simulated datasets. The method further includes training a machine learning (ML) network to predict a model from the observed dataset and determining the predicted model using the trained ML network. The method further includes determining a first model penalty function based on the current model, a second model penalty function based on a difference between the current and the predicted models, and a composite penalty function based on a weighted sum of the data penalty function, the first and the second model penalty functions. Finally, the method includes determining the model based on an extremum of a composite penalty function.

20 Claims, 8 Drawing Sheets

(56) References Cited

U.S. PATENT DOCUMENTS

| | | | |
|---|---|---|---|
| 10,920,585 | B2 | 2/2021 | Colombo et al. |
| 10,996,372 | B2 | 5/2021 | Denli et al. |
| 2016/0086079 | A1 | 3/2016 | De Stefano |
| 2019/0195067 | A1 | 6/2019 | Colombo et al. |
| 2019/0383965 | A1 | 12/2019 | Salman et al. |
| 2020/0088896 | A1 | 3/2020 | Schmedes et al. |
| 2020/0183031 | A1 | 6/2020 | Denli et al. |
| 2020/0183041 | A1 | 6/2020 | Denli et al. |
| 2020/0184374 | A1 | 6/2020 | Liu et al. |
| 2020/0257016 | A1 | 8/2020 | Abdallah et al. |
| 2021/0041596 | A1 | 2/2021 | Kushwaha et al. |
| 2021/0239872 | A1 | 8/2021 | Wheelock et al. |
| 2021/0264262 | A1 | 8/2021 | Colombo et al. |

FOREIGN PATENT DOCUMENTS

| | | | |
|---|---|---|---|
| WO | 2020257263 | A1 | 12/2020 |
| WO | 2021130512 | A1 | 7/2021 |
| WO | 2021168230 | A1 | 8/2021 |

OTHER PUBLICATIONS

Li, Zihang, et al. "Pertinent multigate mixture-of-experts-based prestack three-parameter seismic inversion." IEEE Transactions on Geoscience and Remote Sensing 60 (2022): 1-15. (Year: 2022).*

Colombo D. et al., "High-resolution velocity modeling by seismic-airborne TEM joint inversion: a new perspective for near surface characterization", The Leading Edge, vol. 35, Nov. 2016, pp. 977-985 (9 pages).

Colombo, D. and M. De Stefano, "Geophysical modeling via simultaneous joint inversion of seismic, gravity, and electromagnetic data: Application to prestack depth imaging", The Leading Edge, vol. 26, Mar. 2007, pp. 326-331 (6 pages).

Ronneberger, O. et al., "U-net: Convolutional Networks for Biomedical Image Segmentation", May 2015, pp. 1-8, URL: <https://arxiv.org/abs/1505.04597v1> (8 pages).

Rovetta, Diego and Daniele Colombo, "Analysis of inter-domain coupling constraints for multi-physics joint inversion", Inverse Problems, IOP Publishing Ltd., vol. 34, Nov. 2018, pp. 1-31 (31 pages).

Naeini, Ehsan Zabihi, "A machine learning approach to quantitative interpretation", SEG International Exposition and 89th Annual Meeting, SEG, 2019, pp. 3176-3180 (5 pages).

Biswas, Reetam et al., "Prestack and poststack inversion using a physics-guided convolutional neural network", Interpretation, Society of Exploration Geophysicists and American Association of Petroleum Geologists, vol. 7, No. 3, Aug. 2019, pp. SE161-SA174 (14 pages).

Colombo, Daniele et al., "Deep-learning electromagnetic monitoring coupled to fluid flow simulators", Geophysics, Society of Exploration Geophysicists, vol. 85, No. 4, Jul.-Aug. 2020, pp. WA1-WA12 (12 pages).

Dogru, Ali H. et al., "A Next-Generation Parallel Reservoir Simulator for Giant Reservoirs", SPE 119272, Society of Petroleum Engineers, Feb. 2009, pp. 1-29 (29 pages).

Archie, G.E., "The Electrical Resistivity Log as an Aid in Determining Some Reservoir Characteristics", T.P. 1422, Petroleum Technology, Jan. 1942, pp. 54-62 (9 pages).

International Search Report and Written Opinion of the International Searching Authority issued in corresponding International Application No. PCT/US2021/018753, mailed on Aug. 11, 2021 (20 pages).

Colombo, Daniele et al., "Physics-driven deep learning joint inversion", SEG Technical Program Expanded Abstracts 2020, pp. 1775-1779, Sep. 30, 2020 (8 pages).

Moorkamp, Max et al., "Joint Inversion in Hydrocarbon Exploration: Theory and Applications", In: "Integrated maging of the Earth: Theory and Applications", John Wiley & Sons, Inc, vol. 218, pp. 167-189, Apr. 22, 2016 (23 pages).

Colombo et al.; "Coupled physics-deep learning inversion", Computers & Geosciences; vol. 157; Aug. 25, 2021; pp. 1-13 (13 pages).

He et al.; "Physics-informed neural networks for multiphysics data assimilation with application to subsurface transport", Advances in Water Resources; vol. 141; May 6, 2020; pp. 1-15 (15 pages).

Sun et al.; "Physics-guided deep learning for seismic inversion with hybrid training and uncertainty analysis", Geophysics; vol. 86; Issue 3; May 2021; pp. R303-R317 (15 pages).

Ray, A. and Myer, D.; "Bayesian geophysical inversion with trans-dimensional Gaussian process machine learning", Geophysical Journal International; vol. 217; Feb. 28, 2019; pp. 1706-1726 (21 pages).

Berger et al.; "A Survey of Active Learning for Quantifying Vegetation Traits from Terrestial Earth Obersvation Data", Remote Sensing; vol. 13; No. 2; 287; pp. 1-23 (23 pages), Year: 2021.

Moss, Adam; "Accelerated Bayesian inference using deep learning", Monthly Notices of the Royal Astronomical Society; vol. 496; May 2020; pp. 1-12 (12 pages).

Hannouch, E. H. and Holmstedt, O.; "Deep-learning-accelerated Bayesian inference for state-space models", Master's thesis in Mathematics; Chalmers University of Technology; 2020 (91 pages).

Hooten et al.; "Making Recursive Bayesian Inference Accessible", The American Statistician; vol. 75; No. 2; Sep. 2019 (10 pages).

* cited by examiner

500

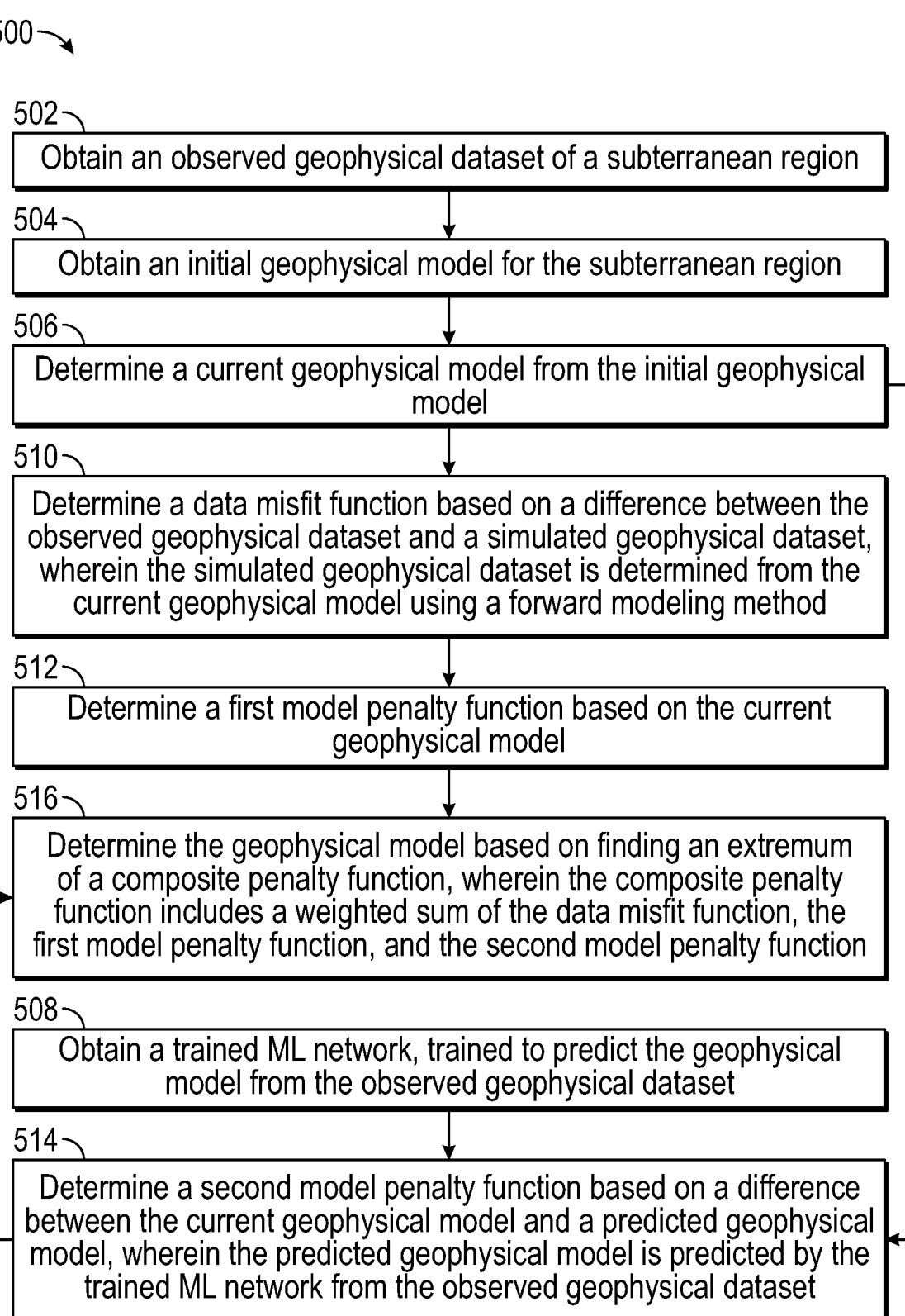

502

Obtain an observed geophysical dataset of a subterranean region

504

Obtain an initial geophysical model for the subterranean region

506

Determine a current geophysical model from the initial geophysical model

510

Determine a data misfit function based on a difference between the observed geophysical dataset and a simulated geophysical dataset, wherein the simulated geophysical dataset is determined from the current geophysical model using a forward modeling method

512

Determine a first model penalty function based on the current geophysical model

516

Determine the geophysical model based on finding an extremum of a composite penalty function, wherein the composite penalty function includes a weighted sum of the data misfit function, the first model penalty function, and the second model penalty function

508

Obtain a trained ML network, trained to predict the geophysical model from the observed geophysical dataset

514

Determine a second model penalty function based on a difference between the current geophysical model and a predicted geophysical model, wherein the predicted geophysical model is predicted by the trained ML network from the observed geophysical dataset

FIG. 5

Drilling System
600

Control System

METHOD FOR PREDICTING A GEOPHYSICAL MODEL OF A SUBTERRANEAN REGION OF INTEREST

BACKGROUND

Geophysical inversion creates computerized representations of a subterranean region of interest based on geophysical and geological observations and their interpretation. Geophysical inversion creates geophysical models that may represent three-dimensional (3D) images of the subterranean region representing the values of physical quantities, such as density or resistivity, as a function of spatial position within the subterranean region. Furthermore, geophysical models may be used in locating and managing the extraction of natural resources like oil and gas.

Generally, geophysical inversion methods that fail to integrate all the available geophysical observation generate geophysical models also fail to identify the most economic, efficient, and effective development options for production of oil and gas from the subterranean region. Accordingly, there exists a need for a method for geophysical inversion methods that integrate all the available geophysical observations in a reliable and effective manner.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter. In general, in one aspect, embodiments relate to methods for determining a geophysical model of a subterranean region. The method includes obtaining an observed geophysical dataset and a current geophysical model for the subterranean region, simulating a simulated geophysical dataset from the current geophysical model, and determining a data penalty function based on a difference between the observed and simulated geophysical datasets. The method further includes training a machine learning (ML) network to predict a predicted geophysical model from the observed geophysical dataset and determining the predicted geophysical model using the trained ML network. The method further includes determining a first model penalty function based on the current model, a second model penalty function based on a difference between the current and the predicted geophysical models, and a composite penalty function based on a weighted sum of the data penalty function, the first and the second model penalty functions. Finally, the method includes determining the geophysical model based on an extremum of a composite penalty function.

In general, in one aspect, embodiments relate to a non-transitory computer readable medium, storing instructions executable by a computer processor. The instructions include functionality for receiving an observed geophysical dataset and a current geophysical model for the subterranean region, simulating a simulated geophysical dataset from the current geophysical model, and determining a data penalty function based on a difference between the observed and simulated geophysical datasets. The instructions further include functionality for training a machine learning (ML) network to predict a predicted geophysical model from the observed geophysical dataset and determining the predicted geophysical model using the trained ML network. The instructions further include functionality for determining a first model penalty function based on the current model, a second model penalty function based on a difference between the current and the predicted geophysical models, and a composite penalty function based on a weighted sum of the data penalty function, the first and the second model penalty functions. Finally, the instructions include functionality for determining the geophysical model based on an extremum of a composite penalty function.

In general, in one aspect, embodiments relate to a system including a computer system, configured to receive an observed geophysical dataset and a current geophysical model for the subterranean region, simulate a simulated geophysical dataset from the current geophysical model, and determine a data penalty function based on a difference between the observed and simulated geophysical datasets. The computer system is further configured to train a machine learning (ML) network to predict a predicted geophysical model from the observed geophysical dataset and determine the predicted geophysical model using the trained ML network. The computer system is further configured to determine a first model penalty function based on the current model, a second model penalty function based on a difference between the current and the predicted geophysical models, and determine a composite penalty function based on a weighted sum of the data penalty function, the first and the second model penalty functions. Finally, the computer system is further configured to determine the geophysical model based on an extremum of a composite penalty function and determine a location of a hydrocarbon reservoir based on the geophysical model of a subterranean region of interest. The system further includes a wellbore planning system configured to plan a planned wellbore path to intersect the location of the hydrocarbon reservoir.

Other aspects and advantages of the claimed subject matter will be apparent from the following description and the appended claims.

BRIEF DESCRIPTION OF DRAWINGS

FIG. 5 shows a flowchart of the method steps for predicting geophysical properties of a formation according to one or more embodiments.

DETAILED DESCRIPTION

Figure 1:
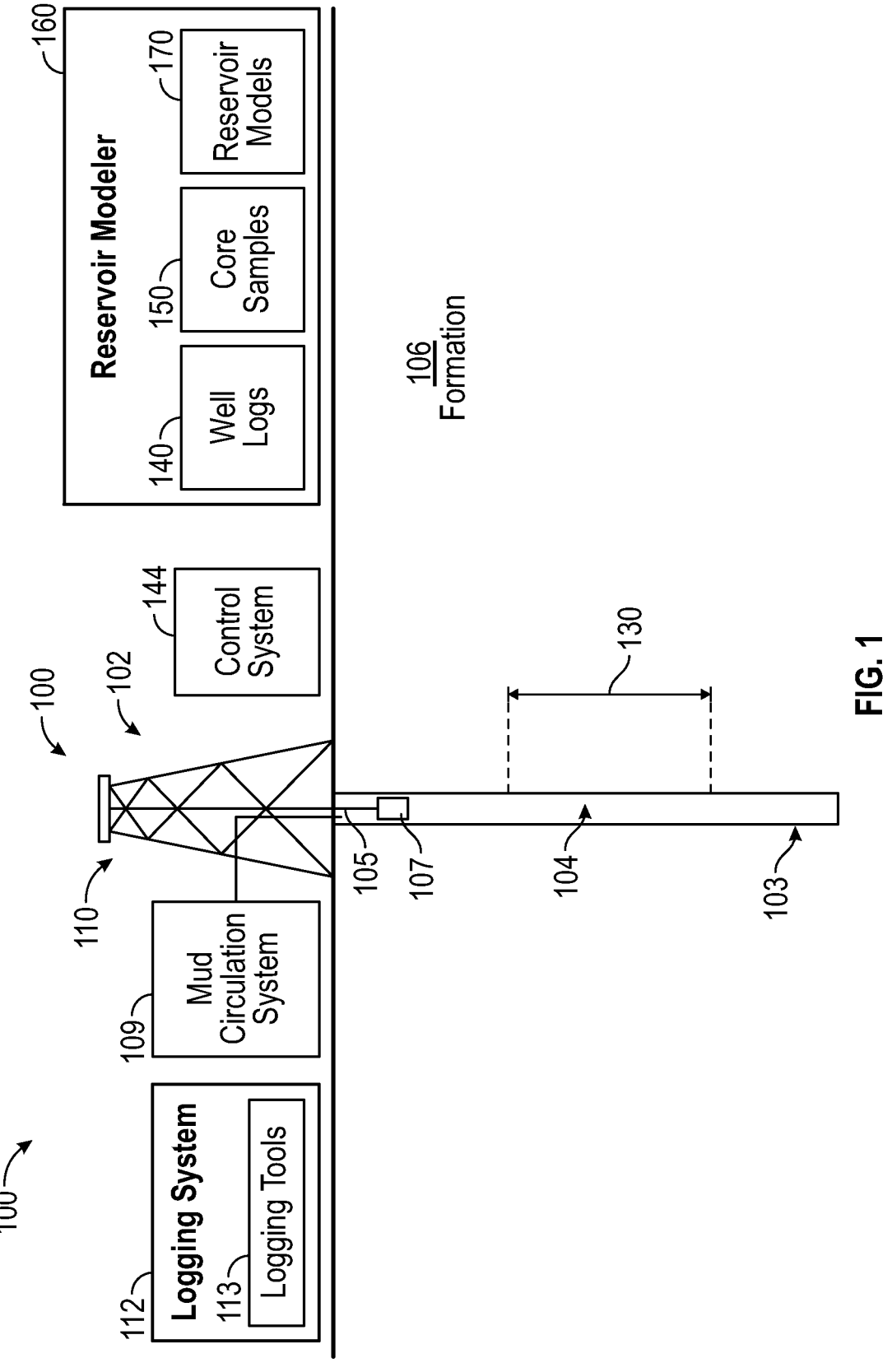
FIG. 1 shows a well environment according to one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-7, any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a geophysical training model" includes reference to one or more of such geophysical training models.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

Embodiments disclosed provide a workflow for determining a geophysical model simultaneously utilizing a physic-based inversion of geophysical data and a machine learning-based prediction from geophysical data. The geophysical data may include a plurality of different data types, and the resulting geophysical model may include a plurality of different geophysical model parameter types.

FIG. 1 illustrates a well environment 100 comprising a well 102 with a wall 103 having a wellbore 104 extending into a formation 106. The wellbore 104 comprises a bored hole that extends from the surface into a target zone of the formation 106, such as a hydrocarbon reservoir (not shown). The formation 106 comprises various geophysical formation properties of interest, such as formation porosity, formation permeability, resistivity, water saturation, and free water level (FWL). Porosity indicates how much void space exists in a particular rock within an area of interest in the formation 106, where oil, gas, or water is trapped. Permeability indicates the ability of liquids and gases that flow through the rock within the area of interest. Resistivity indicates how strongly rock or fluid within the formation 106 opposes the flow of electrical current. For example, resistivity indicates the porosity of the formation 106 and the presence of hydrocarbons. More specifically, resistivity is relatively low for a formation that has high porosity and a large amount of water, and resistivity is relatively high for a formation that has low porosity or comprises a large quantity of hydrocarbons. Water saturation indicates the fraction of water in a given pore space.

Keeping with FIG. 1, the well environment 100 comprises a drilling system 110, a logging system 112, a control system 144, and a hydrocarbon reservoir modeler 160. The drilling system 110 comprises a drill string (105), drill bit (107), and a mud circulation system (109) for use in boring the wellbore 104 into the formation 106. The control system 144 comprises hardware or software for managing drilling operations or maintenance operations. For example, the control system 144 may include one or more programmable logic controllers (PLCs) comprising hardware or software with functionality to control one or more processes performed by the drilling system 110. Specifically, a programmable logic controller may control valve states, fluid levels, pipe pressures, warning alarms, or pressure releases throughout a drilling rig. In accordance with some embodiments, the programmable logic controller may be a ruggedized computer system with functionality to withstand vibrations, extreme temperatures (for example, ~575° C.), wet conditions, or dusty conditions, for example, around a drilling rig. The term "control system" refers broadly to systems that effect control including, for example and without limitation, a drilling operation control system that is used to operate and control the equipment, a drilling data acquisition and monitoring system that is used to acquire drilling process and equipment data and to monitor the operation of the drilling process, and/or a drilling interpretation software system that is used to analyze and understand drilling events and progress.

The logging system 112 includes one or more logging tools 113. The logging tools 113 may be any type of logging tool known in the art, such as a nuclear magnetic resonance (NMR) logging tool or a resistivity logging tool, for use in generating well logs 140 of the formation 106. For example, a logging tool may be lowered into the wellbore 104 to acquire measurements as the tool traverses a depth interval 130 (for example, targeted hydrocarbon reservoir section) of the wellbore 104. Alternatively, the logging tool may be incorporated into the drill string. The plot of the logging measurements versus depth refers to a "log" or "well log". Well logs 140 provide depth measurements of the wellbore 104 that describe such hydrocarbon reservoir characteristics as formation porosity, formation permeability, resistivity, water saturation, and the like. The resulting logging measurements are stored or processed or both, for example, by the control system 144, to generate corresponding well logs 140 for the well 102. A well log comprises a plot of a logging response time versus true vertical depth (TVD) across the depth interval 130 of the wellbore 104.

Hydrocarbon reservoir characteristics are determined using a variety of different techniques. For example, certain hydrocarbon reservoir characteristics may be determined via coring (for example, physical extraction of rock samples) to produce core samples 150. Alternatively, or additionally, hydrocarbon reservoir characteristics may be determined by logging operations (for example, wireline logging, logging-while-drilling (LWD) and measurement-while-drilling (MWD)). Coring operations comprise physically extracting a rock sample from a region of interest within the wellbore 104 for detailed laboratory analysis. For example, when drilling an oil or gas well, a coring bit cuts plugs (or "cores") from the formation 106 and bring the plugs to the surface. These core samples are then analyzed at the surface (for example, in a lab) to determine various characteristics of the formation 106 at the location where the sample was obtained. One example of a hydrocarbon reservoir characteristic is the amount of oil present in the hydrocarbon reservoir. Another characteristic is the permeability of the hydrocarbon reservoir rock. Hydrocarbon reservoir monitoring is an operation involving the mapping of fluid movements within the hydrocarbon reservoir as a consequence of oil production.

Multiple types of logging techniques are available for determining various hydrocarbon reservoir characteristics. For a particular application, one or more form of logging may be selected and used based on the logging conditions and the type of desired measurements. For example, NMR logging measures the induced magnetic moment of hydrogen nuclei (that is, protons) contained within the fluid-filled pore space of porous media (for example, hydrocarbon reservoir rocks). Thus, NMR logs measure the magnetic response of fluids present in the pore spaces of the hydrocarbon reservoir rocks. In doing so, NMR logs measure both porosity and permeability as well as the types of fluids present in the pore spaces. For determining permeability, another type of logging is used that is called spontaneous potential (SP) logging. SP logging determines the permeabilities of rocks in the formation 106 by measuring the amount of electrical current generated between a drilling fluid produced by the drilling system 110 and formation water that is present in pore spaces of the hydrocarbon reservoir rock. Porous sandstones with high permeabilities generate more electricity than impermeable shales. Thus, SP logs are used to identify sandstones from shales.

To determine porosity in the formation 106, various types of logging techniques are used. For example, the logging system 112 may measure the speed at which acoustic waves travel through rocks in the formation 106. This type of logging generates borehole compensated (BHC) logs, which are also called sonic logs and acoustic logs. Sound waves travel faster through shales than through sandstones because shales have greater density than sandstones. Likewise, density logging also determines porosity by directly measuring the density of the rocks in the formation 106. In addition, neutron logging determines porosity by assuming that the hydrocarbon reservoir pore spaces within the formation 106 are filled with either water or oil and then measuring the amount of hydrogen atoms (that is, neutrons) in the pores. Furthermore, the logging system 112 may determine geological data for the well 102 by measuring corresponding well logs 140 and data regarding core samples 150 for the well 102.

Keeping with the various types of logging techniques, resistivity logging measures the electrical resistivity of rock or sediment in and around the wellbore 104. In particular, resistivity measurements may determine what types of fluids are present in the formation 106 by measuring how effective these rocks are at conducting electricity. Fresh water and oil are both poor conductors of electricity, thus they have high relative resistivities. For example, an electrical resistivity of crude oil ranges from $4.0 \times 10^6$ to $1.5 \times 10^8$ ohm-meter and the electrical resistivity of fresh water is in the range of 10-100 ohm-meter. However, in hydrocarbon reservoirs, pores are seldom filled with pure water or pure crude oil and the resistivity contrasts are much smaller. For example, in mainly water-filled formations the resistivity values may lie in the range 0.2-10 ohm-meter, while in mainly oil-filled formations the resistivity values may lie in the range 20-2000 ohm-meters. As such, resistivity measurements obtained via such logging may be used to determine corresponding hydrocarbon reservoir water saturation (Sw).

Turning to the hydrocarbon reservoir modeler 160, the hydrocarbon reservoir modeler 160 comprises hardware or software with functionality for generating one or more hydrocarbon reservoir models 170 regarding the formation 106. For example, the hydrocarbon reservoir simulator 160 may store (or receive) well logs 140 and data regarding core samples 150, and further analyze the well log data, the core sample data, seismic data, or other types of data to generate or update the one or more hydrocarbon reservoir models 170. The hydrocarbon reservoir modeler 160 may couple to the logging system 112 and the drilling system 110.

In some embodiments, the hydrocarbon reservoir modeler 160 comprises functionality for applying deep learning or artificial intelligence methodologies to precisely determine various subsurface layers. To do so, a large amount of interpreted data may be used to train a geophysical model. To obtain this amount of data, the hydrocarbon reservoir modeler 160 augments acquired data for various geological scenarios and drilling situations. For example, drilling logs provide similar log signatures for a particular subsurface layer except where a well encounters abnormal cases. Such abnormal cases comprise changes in subsurface geological compositions, well placement of artificial materials, or various subsurface mechanical factors that affect logging tools. As such, the amount of well data with abnormal cases available to the hydrocarbon reservoir modeler 160 may be insufficient for training a geophysical model. Therefore, in some embodiments, a hydrocarbon reservoir simulator 160 uses data augmentation to generate a dataset that combines original acquired data with augmented data based on geological and drilling factors. The supplemented dataset provides sufficient geophysical training data to train a geophysical model accordingly.

In some embodiments, the hydrocarbon reservoir modeler 160 is implemented in a software platform for the control system 144. The software platform obtains data acquired by the drilling system 110 and logging system 112 as inputs, which comprise multiple data types from multiple sources. The software platform aggregates the data from these systems 110, 112 in real time for rapid analysis. Real-time of or relating to computer systems in the software platform is defined as the actual time for updating information with instantaneous processing at the same rate as required by a user or necessitated by a process being controlled.

Figure 2:
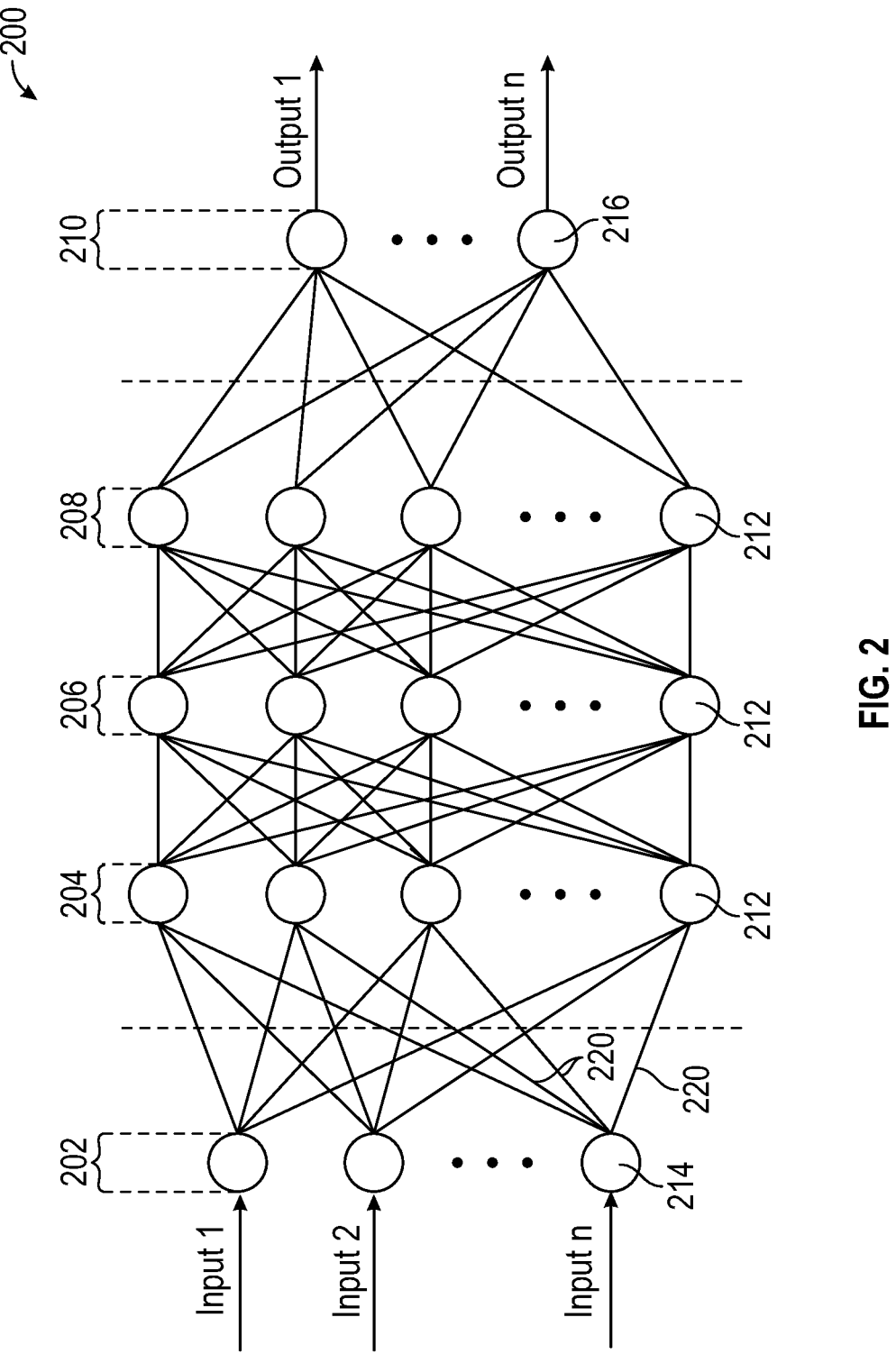
FIG. 2 shows a machine learning network in accordance with one or more embodiments.

FIG. 2 illustrates an artificial neural network (200) (hereinafter also "neural network") in accordance with one or more embodiments. A neural network (200) uses a series of mathematical functions to make predictions based on observations. A neural network (200) may include an input layer (202), hidden layers such as a first hidden layer (204), a second hidden layer (206), a third hidden layer (208) and an output layer (210). Each layer represents a vector where each element within each vector is represented by an artificial neuron, such as artificial neuron (212) (hereinafter also "neuron"). An artificial neuron is loosely based on a biological neuron of the human brain. The input layer (202) may receive an observed data vector x where each neuron, such as neuron (214), within the input layer (202) receives one element $x_i$ within x. Each element is a value that represents a datum that is observed. The vector x may be called "input data" and, in some embodiments, may be geophysical data. FIG. 2 displays the input data or vector x as elements $x_1$, $x_2$, . . . $x_n$, where $x_1$ may be a value that represents a measured value of gravity at a first spatial position, $x_2$ may be a value that represents a measured value of gravity at a second spatial position, etc.

The output layer (210) may represent the vector y where each neuron, such as neuron (216) within the output layer (210) represents each element $y_i$ within y. The vector y may be called "output data" and, in some embodiments, may be a predicted geophysical model. FIG. 2 displays the output data or vector y as two elements $y_1$ and $y_2$ where $y_1$ may be a value that represents density at a first spatial location within a subterranean region and $y_2$ represents density at a second spatial location within a subterranean region.

Neurons in the input layer (202) may be connected to neurons in the first hidden layer (204) through connections, such as connections (220). A connection (220) may be analogous to a synapse of the human brain and may have a weight associated to it. The weights for all connections (220) between the input layer (202) and the first hidden layer (204) make up a first array of weights $w_{ij}$ where:

$$w_{ij} = \begin{bmatrix} w_{11} & w_{12} & w_{13} \\ w_{21} & w_{22} & w_{23} \\ w_{31} & w_{32} & w_{33} \end{bmatrix},$$   Equation (1)

for the embodiment shown in FIG. 2. The elements in each column are the weights associated with the connections (220) between each of the three elements in vector $x_i$ that propagate to the same neuron (212) in the first hidden layer (204). The vector $x_i$ and the first array of weights $w_{ij}$ may be multiplied together, the bias terms $b_j$ added, if applicable, and scaled by the activation functions $g_j$ to determine the vector $a_j$ where each element may be a value represented by a neuron (212) in the first hidden layer (204) such that:

$$a_j = g_j(b_j + \Sigma_i x_i w_{ij}).$$   Equation (2)

Each weight within the first array of weights $w_{ij}$ may amplify or reduce the significance of each element within vector $x_i$. The bias terms $b_j$ shift the vector $x_i$ and the activation functions $g_j$ determine the amplitude of the weighted summation. The activation functions $g_j$ may be, without limitation, an identity function, a logistic function, a sigmoid function, a hyperbolic tangent function, a Gaussian error linear unit (GELU) function, a softplus function, a Gaussian function, a shifted quadratic unit (SQU) function, and a decaying sine unit function. The activation functions selected may depend, at least in part, on if the neural network (200) is being used to solve a regression problem or a classification problem.

Similarly, the weights for all connections (220) between the first hidden layer (204) and the second hidden layer (206) make up a second array of weights $w_{jk}$. The vector $a_j$ and the second array of weights $w_{jk}$ may be multiplied together, the bias terms $b_k$ added, if applicable, and scaled by the activation functions $g_k$ to determine the vector $a_k$ where each element is a value represented with a neuron (212) in the second hidden layer (204) such that:

$$a_k = g_k(b_k + \Sigma_j a_j w_{jk}).$$   Equation (3)

Continuing with the embodiment of FIG. 2, the weights for all connections (212) between the second hidden layer (206) and the output layer (210) make up a third array of weights $w_{kl}$. The vector $a_k$ and the third array of weights $w_{kl}$ may be multiplied together, the bias terms $b_l$ added, if applicable, and scaled by the activation functions $g_l$ to determine the vector $y_l$. A person of ordinary skill in the art will appreciate that FIG. 2 depicts one highly simplified version of the action of a neural network (200). The weights between the second hidden layer (206) and subsequent layers, such as hidden layer (208) are handled in a similar manner.

For a neural network (200) to complete a "task" of predicting output data from observed input data, the neural network (200) must first be trained. Training may be defined as the process of determining the values of the weights within each array of weights and the values of each bias term such that the neural network (200) makes accurate predictions. Training may be performed iteratively, where each iteration is referred to as an "epoch", using training data and backpropagation. The training data may be a plurality of input data and a plurality of output data both of which are observed. Assume a plurality of vectors $$x_m^n$$

and a plurality of vectors $$y_p^m$$

collectively make up the training data. Backpropagation is defined as using a gradient descent algorithm to update the weights and bias terms within a neural network (200). Gradient descent algorithms may include, without limitation, stochastic gradient descent, batch gradient descent, Momentum gradient descent, Adadelta gradient descent, Adam gradient descent, and Nadam gradient descent.

Prior to training a neural network, the weights within all arrays of weights and the bias terms may be initialized as small, random values. During training, the input data within a batch of training data, such as $$x_m^1 \text{ through } x_m^5,$$

may be input into the neural network (200) to predict $$y_p^1 \text{ through } y_p^5.$$

The predicted vectors $$y_p^1 \text{ through } y_p^5.$$

are then compared to the output data within the batch of training data $$y_p'^1 \text{ through } y_p'^5$$

using a residual function R. The residual function R may also be referred to as a penalty function, an objective function, a cost function, a loss function, or an error function. In some embodiments, the residual function R may be the sum of the squared errors such that:

$$R = \frac{1}{2}\sum_{n=1}^{5}\left(y_p^n - y_p'^n\right)^2.$$

Equation (4)

The gradient of the residual function R with respect to each of the weights may then be determined and used by a gradient descent algorithm to adjust each weight and each bias term in the proper direction. Additional epochs using a plurality of batches within the training data may be performed. In some embodiments, a neural network may be considered adequately trained once the residual function R for all training data reaches a threshold or once a pre-defined number of epochs have been performed.

Following training, the neural network (200) may perform a task where the vector $$x_m^1,$$

a part of the training data, is input into the neural network (200) to predict the vector $$y_p^1$$

where the residual between $$y_p^1 \text{ and } y_p'^1$$

should be negligible.

Figure 3:
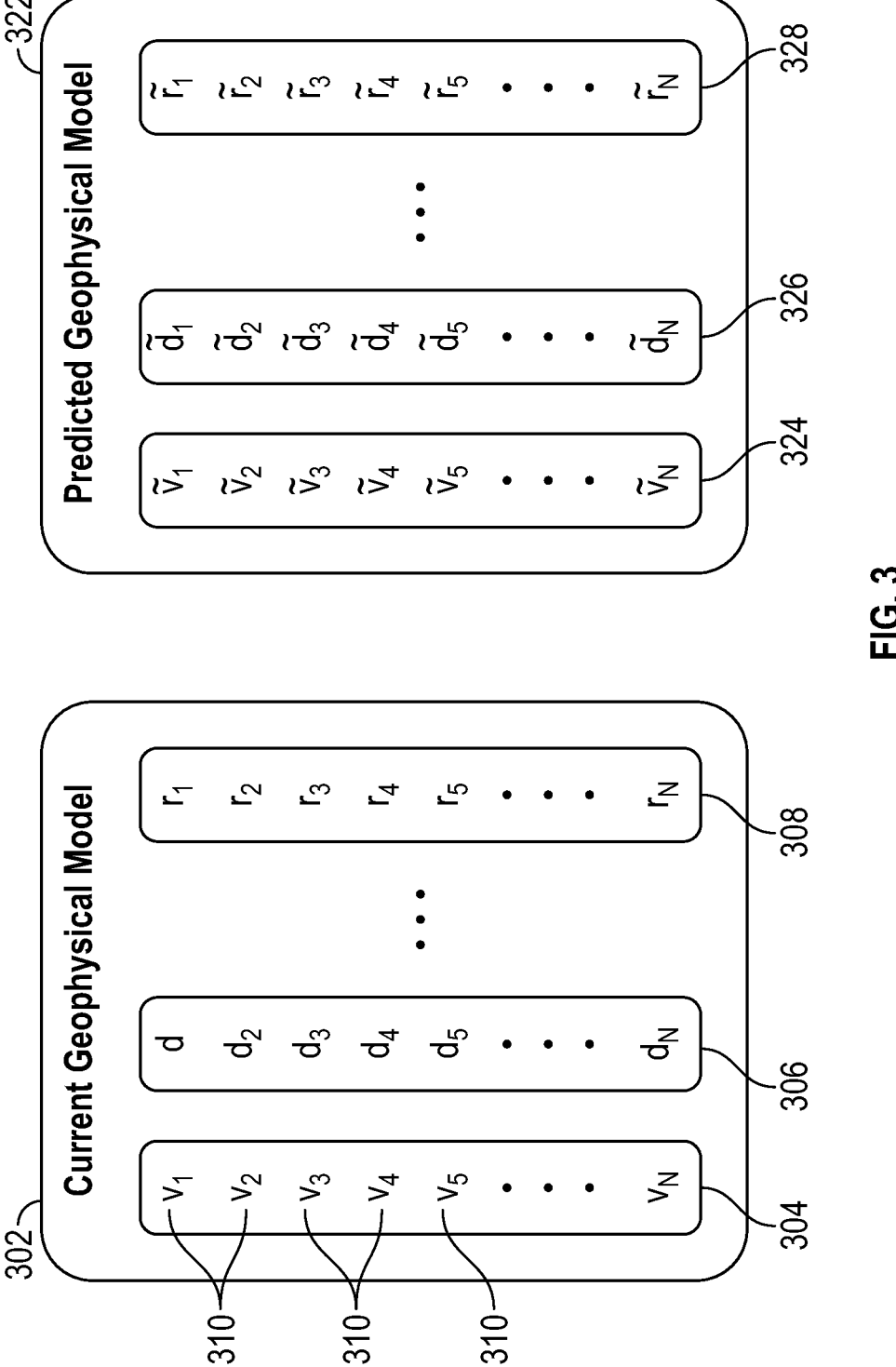
FIG. 3 shows geophysical models in accordance with one or more embodiments.

FIG. 3 shows geophysical models in accordance with one or more embodiments. A current geophysical model (302) may contain a plurality of geophysical parameters describing one or more formations (106) in a subterranean region. The value of one or more geophysical parameters, such as geophysical parameters (310), may be specified at each node of a 3D grid representing the subterranean region. One or more geophysical model parameter types may be specified in the current geophysical model. For example, there may be seismic velocity parameters (304), density parameters (306), and resistivity parameters (308).

Similarly, a predicted geophysical model (322) may contain a plurality of geophysical parameters describing one or more formations (106) in a subterranean region. One or more geophysical model parameter types may be specified in the current geophysical model. As in the current geophysical model (302), there may be seismic velocity parameters (324), density parameters (326), and resistivity parameters (328) in the predicted geophysical model (322). The values of each geophysical model parameter may differ between the current geophysical model (302) and the predicted geophysical model (322) because the method of determining the parameter values differ, as illustrated in FIG. 4.

Figure 4:
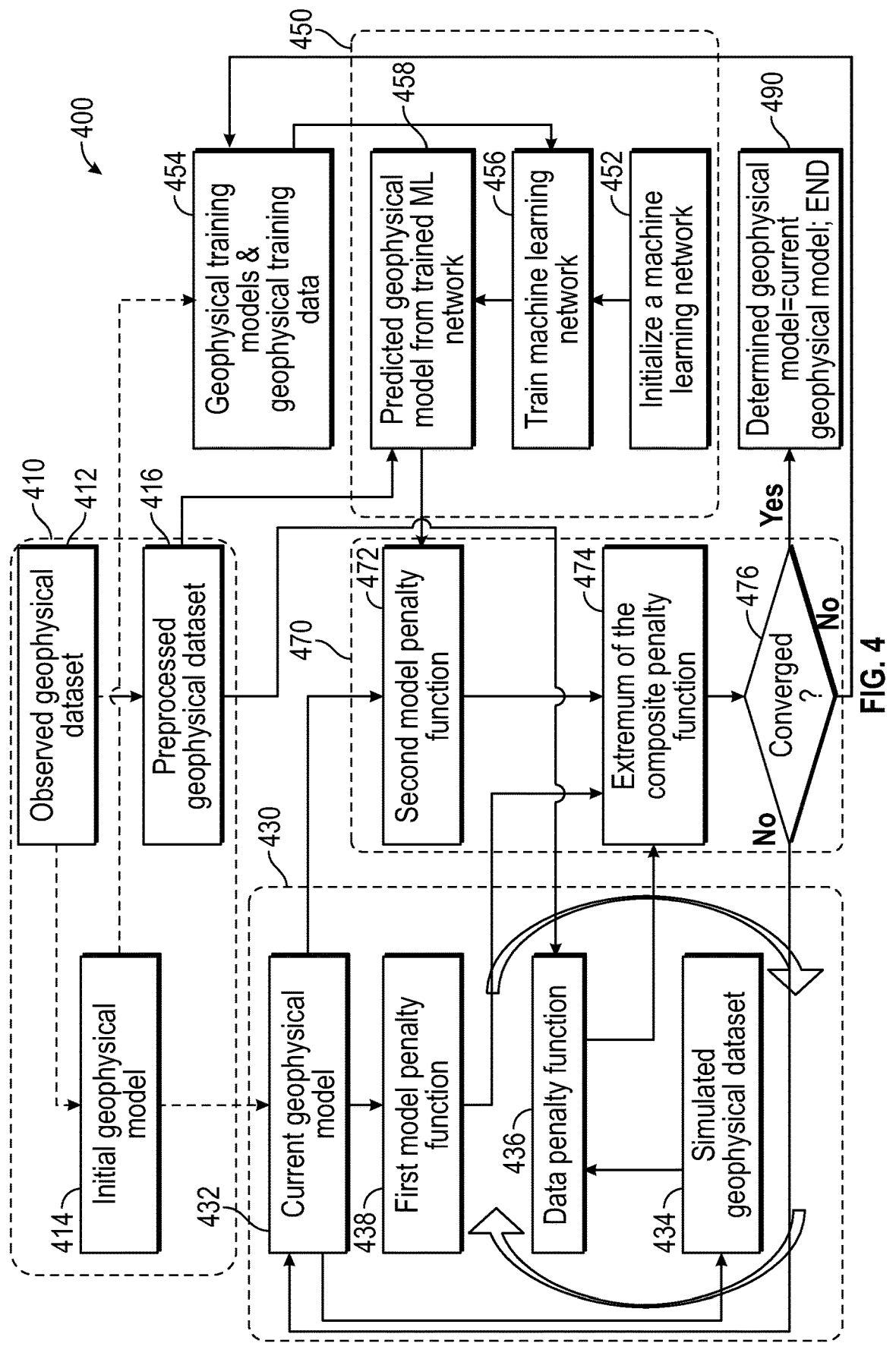
FIG. 4 shows a flowchart for predicting a geophysical model in according to one or more embodiments

In accordance with one or more embodiments, FIG. 4 shows a flowchart 400 for predicting a geophysical model of a formation. Flowchart (400) is divided into four portions (410, 430, 450 and 470) that are described in turn below.

Turning now to portion (410), portion (410) includes the obtaining of an observed geophysical dataset (412). The obtained geophysical dataset (412) may contain one or more geophysical data types. For example, the observed geophysical dataset (412) may include, without limitation, a seismic dataset, a gravity dataset, an active source resistivity dataset, a magneto-telluric dataset, or any combination of these datasets. The observed geophysical dataset (412) may be acquired using sensors deployed aerially, on the surface of the earth, or downhole, without departing from the scope of the invention.

In Block (414) an initial geophysical model may be obtained. In accordance with some embodiments the initial geophysical model (414) may be obtained from the observed geophysical dataset (412). For example, the initial geophysical model (414) may be obtained from the observed geophysical dataset (412) using crude or approximate methods. In other embodiments, the initial geophysical model (414) may be obtained using plausible assumptions about the structure of the subterranean region.

Alternatively, the initial geophysical model may be determined from simplistic assumptions, such as the assumption that density or seismic velocity increase linearly with depth and be invariant with respect to horizontal location, without departing from the scope of the invention. The initial geophysical model (414) may be regarded as depicting a crude approximation to the structure of the subsurface. The initial geophysical model may take the form of a three-dimensional (3D) grid with a value of a physical parameter specified at each node In some embodiments, the 3D grid may be a Cartesian grid and in other embodiments the 3D grid may be an irregular grid.

In cases where the observed geophysical dataset (412) includes a plurality of geophysical data types, such as seismic measurements and gravity measurements, the initial geophysical model (414) may contain plurality of geophysical model parameter types, such as seismic velocity and density. Similarly, if the observed geophysical dataset (412) contains magneto-telluric data the initial geophysical model (414) may contain resistivity parameters.

In Block (416) a preprocessed geophysical dataset may be derived from the observed geophysical dataset may be determined from the observed geophysical dataset (412). The preprocessing may include without limitation, applying noise reduction techniques, filtering, and smoothing the observed geophysical dataset (412).

Turning now to portion (430), portion (430) of the flowchart (400) depicts an iterative physics-based inversion process. In Block (432) a current geophysical model may be determined. Initially the current geophysical model (432) may be defined to be equal to the initial geophysical model (414). The current geophysical model (432) may be updated with each iterative loop of the inversion.

In Block (434) a simulated geophysical dataset may be generated from the current geophysical model (432). The simulation may be performed by solving mathematical equations that describe the physical laws governing the relationship between the geophysical dataset and the current geophysical model. For example, for gravity surveys Newton's gravitational law gravitation governs the prediction of the gravity measurement from the density of the subterranean region. Similarly, for seismic surveys Newton's second law (the equation of motion) and the constitutive relation for elastic materials govern the prediction of seismic measurements from the elastic properties and density of the subterranean region. These mathematical equations may be solved using numerical methods such as, without limitation, finite-difference, finite-element or discrete Galerkin algorithms.

In Block (436) a data penalty function may be formed that measures the difference between the simulated geophysical dataset (434) and the preprocessed geophysical dataset (416). In some embodiments the data penalty function, $\phi_d$(m), may be a least squares penalty function:

$$\phi_d(m) = (Gm - d_{obs})^T W_d^T W_d (Gm - d_{obs}) = \|W_d(Gm - d_{obs})\|^2_{L_2}, \quad \text{Equation (5)}$$

where Gm represents the simulated geophysical dataset obtained by applying a Jacobian function operator, G, to the current geophysical model, m, $d_{obs}$ is the observed geophysical dataset, and $W_d$ represents a data weighting matrix (and $$W_d^T W_d$$

is the equivalent inverse covariance). In other embodiments, other data penalty functions (436) may be used without departing from the scope of the invention.

In addition to the data penalty function (436) a first model penalty function may be determined in Block (438). The first model penalty function may be designed to encourage the formation of a number of features of the current geophysical model. For example, it may encourage the current geophysical model (432) to resemble a reference geophysical model. Further, it may encourage the geophysical model parameters related to different geophysical datatype to show similar spatial variation. Further still it may encourage the values of different geophysical model parameters to exhibit correlations with one another. In accordance with some embodiments, the first model penalty function (438) may include more than one term, for example it may contain three terms.

The first term, $\phi_m$(m), may measure the deviation of the current geophysical model from a reference geophysical model, denoted $m_0$. In accordance with some embodiments the reference geophysical model may accurately describe the subterranean region along a wellbore trajectory. Alternative, the reference geophysical model may be the result of interpolating, extrapolating, or kriging the geophysical model determined along a plurality of wellbore trajectories to create a reference geophysical model for the entire subterranean region.

The first term of the first model penalty function (438) may be termed a reference model penalty function and written as:

$$\phi_m(m) = (m - m_0)^T W_m^T W_m (m - m_0) = \|W_m(m - m_0)\|^2_{L_2}, \quad \text{Equation (6)}$$

where $W_m$ represents a data weighting matrix (and $$W_m^T W_m$$

is the equivalent model inverse covariance).

A second term of the first model penalty function (438) may be a structural penalty function and may measure the dissimilarity between the spatial structure of geophysical model parameters describing different geophysical data types. This second term may be referred to as a structural penalty function. For example, the structural penalty function may measure the dissimilarity between the structure of the model describing seismic velocity and the structure of the model describing resistivity of the subsurface. In some embodiments, the structural penalty function may be small when discontinuities in each set of model parameters are coincident with one another. In other embodiments, the structural penalty may be small when the spatial gradient of each set of model parameters are coincident with one another.

For example, in some embodiments the spatial structure penalty function, $\phi_{sp}$(m), may be written as:

$$\phi_{sp}(m) = \sum_{i=1}^{M} \sum_{j=i+1}^{M} \sum_{k=1}^{K} w_{i,j,k} |sp_k(m_i, m_j)|^2, \quad \text{Equation (7)}$$

where K are the number of grid cells in the geophysical model, M are the number of geophysical data types (e.g., seismic, gravity, magneto-telluric, etc.), and $sp_k$ may be defined as:

$$sp_k(m_i, m_j) = \nabla m_i \times \nabla m_j, \quad \text{Equation (8)}$$

or $$sp_k(m_i, m_j) = \frac{\nabla m_i}{\sqrt{|\nabla m_i|^2 + \varepsilon^2}} + h \frac{\nabla m_j}{\sqrt{|\nabla m_j|^2 + \varepsilon^2}}, \quad \text{Equation (9)}$$

where $\nabla$ is the spatial gradient operator, $h=\pm 1$ is the correlation sign, and $\varepsilon$ is a damping parameter.

Furthermore, in accordance with some embodiments a third penalty term of the first model penalty function (438) may be defined to measure the compositional correlation between different set of model parameters. For example, in well logs recorded in wells penetrating the subterranean region of interest it may be observed that seismic velocity values and density values may be correlated. This may be expected because denser rocks may also be more rigid (and consequently have higher seismic velocities). It may be desirable that geophysical models that also exhibit this correlation are desired, and the third penalty term of the model penalty function (438) may prompt this property. The third penalty term may be termed a compositional penalty function, denoted $\phi_{cp}$(m):

$$\phi_{cp}(m) = \sum_{i=1}^{M} \sum_{j=i+1}^{M} \sum_{k=1}^{K} v_{i,j,k} |cp_k(m_i, m_j)|^2, \quad \text{Equation (10)}$$

where $cp_k(m_i,m_j)$ is the compositional penalty between two sets of geophysical model parameters $m_i$ and $m_j$ corresponding to different geophysical data types, at the k-th model grid cell, and $v_{i,j,k}$ is a weight.

In accordance with one or more embodiments the first model penalty term (438) may be a weighted sum of the reference model penalty function, the structural penalty function and the compositional penalty function.

Turning now to portion (450) of the flowchart (400), portion (450) depicts an iterative artificial intelligence (AI) inversion scheme. Specifically, the AI inversion scheme may be a machine learning (ML) inversion scheme.

In Block (452) a machine learning network may be initialized. The machine learning network maybe an artificial neural network (ANN). In particular, the ANN may be a deep learning (DL) network. The DL network is depicted in FIG. 2 and described in the context thereof. In brief, initializing the ML network may include providing an initial value for a plurality of network parameters $\theta_0$. The network parameters may include a set of weights and biases for the plurality of nodes within the ML network.

In Block (454) a set of geophysical training models and a set of corresponding geophysical training datasets may be provided. In accordance with one or more embodiments, the set of geophysical training models may be based, at least in part, on the initial geophysical model (414). For example, in some embodiments, the geophysical training models may have parameter values that are similar to those of the initial geophysical model (414). Alternatively, the geophysical training models may be constructed by adding a random perturbation to the parameter values for the initial geophysical model (414).

In accordance with one or more embodiments, for each geophysical training model a corresponding geophysical training dataset may be simulated. The simulation may be performed by solving mathematical equations that describe the physical laws governing the relationship between the geophysical training dataset and the geophysical training model. For example, for gravity surveys Newton's gravitational law gravitation governs the prediction of the gravity measurement from the density of the subterranean region. Similarly, for seismic surveys Newton's second law (the equation of motion) and the constitutive relation for elastic materials govern the prediction of seismic measurements from the elastic properties and density of the subterranean region. These mathematical equations may be solved using numerical methods such as, without limitation, finite-difference, finite-element or discrete Galerkin algorithms.

In Block 456, in accordance with one or more embodiments, the ML network may be trained to predict a predicted geophysical model based on a geophysical dataset. During the training phase each geophysical dataset is drawn from the geophysical training datasets. The training may be performed by inputting the geophysical training dataset, $d_t$, into the input layer (210) of the ML network (200) and allowing the ML network (200) to predict a predicted geophysical model, $m_l$, output from the output layer (250) of the ML network (200). The predicted geophysical model, $m_l$ may be written as a pseudo-inverse operator $$H_\theta^\dagger$$

that is a function of the ML network parameters $\theta_0$ applied to the geophysical training dataset, $$d_t, \text{ i.e., } m_l = H_\theta^\dagger d_t.$$

In accordance with one or more embodiments, training penalty function $$\phi_{l,m} = \left\| H_\theta^\dagger d_t - m_t \right\|_{L_2}^2 = \left\| m_l - m_t \right\|_{L_2}^2$$

may be formed to compare the predicted geophysical model and the corresponding geophysical training model. Training the ML network includes modifying the ML network parameters $\theta_0$ to minimize the training penalty function $\phi_{l,m}$ when summed over the set of geophysical training models and corresponding geophysical training datasets.

In accordance with some embodiments, the training penalty function may also contain a second term. This second term of the training penalty function (456) may be a structural penalty function and may measure the dissimilarity between the spatial structure of geophysical model parameters describing different geophysical data types in the predicted geophysical model. In some embodiments, the structural penalty function may be small when discontinuities in each set of model parameters are coincident with one another. In other embodiments, the structural penalty may be small when the spatial gradient of each set of model parameters are coincident with one another.

In accordance with some embodiments, the training penalty function may also contain a third term. This third term of the training penalty function (456) may be a compositional penalty function and may measure the dissimilarity between the correlation between geophysical model parameters describing different geophysical data types in the predicted geophysical model. In some embodiments, the compositional penalty function may be small when geophysical model parameters describing different geophysical data types are well correlated one with the other.

In Block (458), the trained ML network (456) may be applied to the preprocessed geophysical dataset (416), $d_{pp}$, to predict a predicted geophysical model, $m_p$, corresponding to the preprocessed geophysical dataset $$(416), \text{ i.e., } m_p = H_\theta^\dagger d_{pp}.$$

The predicted geophysical model, $m_p$, is a ML network prediction of a geophysical model $m_p$ for the subterranean region.

Turning now to portion (470) of flowchart (400), in portion (470) the ML network predicted geophysical model (458) and the physic-based current geophysical model (432) may be combined in a manner designed to promote their convergence to the same geophysical model values.

In Block (472) a second model penalty function may be determined, in accordance with one or more embodiments. The second model penalty function may be designed to promote a progressive similarity between current geophysical model and the predicted geophysical model over the course of the workflow. In accordance with some embodiments, the second model penalty function (472) may include more than one term, for example it may contain three terms. The first term of the second model penalty function (472) may be a measure of the difference between the current geophysical model (432) and the predicted geophysical model (458) predicted by the trained ML network. The second term of the second model penalty function (472) may be a measure of the differences in the spatial variation of current geophysical model (432) and the predicted geophysical model (458). The third term of the second model penalty function (472) may be a measure of the correlation between the values of current geophysical model and the predicted geophysical model.

The first term, $\phi_m(m, m_p(\theta))$, may measure the difference between the current geophysical model, m, (432) and the predicted geophysical model (458), denoted $m_p$. In accordance with some embodiment, $\phi_m(m, m_p(\theta))$ may be written as:

$$\phi_m(m, m_p(\theta)) = (m - m_p(\theta))^T W_{m,p}^T W_{m,p}(m - m_p(\theta)), \quad \text{Equation (11)}$$

where $m_p$ is the predicted geophysical model obtained during the training phase and $W_{m,p}$ is a geophysical model covariance matrix.

A second term of the second model penalty function (472) may be a structural penalty function and may measure the dissimilarity between the spatial structure of the current geophysical model (432) and the predicted geophysical model (458). In some embodiments, the structural penalty function may be small when discontinuities in the current geophysical model (432) and the predicted geophysical model (458) are coincident with one another. In other embodiments, the structural penalty may be small when the spatial gradient of the current geophysical model (432) and the predicted geophysical model (458) are colinear.

For example, in some embodiments the spatial structure penalty function, $\phi_{sp}(m, m_p(\theta))$, may be written as:

$$\phi_{sp}(m, m_p(\theta)) = \qquad\qquad \text{Equation (12)}$$
$$\sum_{i=1}^{M}\sum_{j=i+1}^{M}\sum_{k=1}^{K} w_{l(i,j,k)}|sp_k(m_i, m_{p(j)}(\theta))|^2,$$

where $m_i$ is a first set of geophysical model parameters in the current geophysical model (432) and $m_{p(j)}$ is a second set of geophysical model parameters in the predicted geophysical model (458) with all parameters defined over a 3D grid of K cells, $sp_k$ is a structure operator vector at the grid cell k, and $w_{l(i,j,k)}$ are the weights.

Furthermore, in accordance with some embodiments a third penalty term of the second model penalty function (472) may be defined to measure the compositional correlation between a first set of geophysical model parameters in the current geophysical model (432) and a second set of geophysical model parameters in the predicted geophysical model (458). For example, between seismic velocity values in the current geophysical model (432) and density values in the predicted geophysical model (458). The third penalty term may be termed a compositional penalty function, denoted $\phi_{cp}(m)$:

$$\phi_{cp}(m, m_p(\theta)) = \qquad\qquad \text{Equation (13)}$$
$$\sum_{i=1}^{M}\sum_{j=i+1}^{M}\sum_{k=1}^{K} v_{l(i,j,k)}|cp_k(m_i, m_{p(j)}(\theta))|^2,$$

where $cp_k$ is the compositional penalty difference between geophysical models at the grid cell k; and $v_{l(i,j,k)}$ are the weights of a corresponding covariance matrices between geophysical models $m_i$ and $m_j$.

In Block (474), in accordance with one or more embodiments, a composite penalty function may be formed by combining the data penalty function, the first model penalty function, and the second model penalty function. For example, the composite penalty function may be a weighted sum of the data penalty function, the first model penalty function, and the second model penalty function. Furthermore, in Block (474) an extremum of the composite penalty function may be found by updating the current geophysical model (432) to produce the extremum of the composite penalty function. In some embodiments, the extremum may be a minimum, while in other embodiments, the extremum may be a maximum.

In Block (476), in accordance with one or more embodiments a convergence test may be applied to the composite penalty function. Some possible forms of the convergence test are described below. If the convergence test is passed, the workflow may terminate by assigning the current geophysical model to be the (final) updated geophysical model (490). However, if the convergence test is failed the workflow iterates. In the portion (430) the updated geophysical model becomes the current geophysical model, and the loop containing Blocks (434), (436), (438), (474) and (476) iterates. In portion (450) the geophysical training models and corresponding geophysical training data may be augmented by the updated geophysical model and the corresponding simulated geophysical dataset. Further, in accordance with one or more embodiments, in Block 456, the trained ML network may be retrained using the augmented set of geophysical training models and corresponding geophysical training data.

In portion (450), in accordance with one or more embodiments, the retrained ML learning network determined in Block (456) may be used to predict a new predicted geophysical model in Block (458) and the loop containing Blocks (456), (458), (472), and (474) iterates.

In Block (476), in accordance with one or more embodiments a convergence test may be applied. For example, in some embodiments the convergence condition may be that the extremum value is a minimum value of the composite penalty function and may be smaller than a predetermined value. In other embodiments, the convergence condition may be that the value of the composite penalty function has decreased by less than a predetermined value from the previous evaluation of the composite penalty function. In still other embodiments, the extremum value is a maximum value of the composite penalty function and may be greater than a predetermined value. The convergence test may, in other embodiments, be that a predetermined number of iterations of the iterative loops contained in portions (430) and (450) have been completed, irrespective of the final value of the composite penalty function.

In accordance with one or more embodiments, FIG. 5 shows a flowchart (500) for predicting a geophysical model of a formation.

In Step 502, an observed geophysical dataset may be obtained for a subterranean region of interest. In some embodiments, the observed geophysical dataset may be, without limitation, a seismic dataset, a gravity survey dataset, and active source resistivity dataset, or a magnetotelluric dataset.

In Step 504, an initial geophysical model, $m_0$, may be obtained for the subterranean region of interest. The initial geophysical model $m_0$ describes a plurality of geophysical parameter of the subterranean region. In accordance with some embodiments, the initial geophysical model may take the form of a three-dimensional (3D) grid with a value of a geophysical parameter specified at each node. In some embodiments, the 3D grid may be a Cartesian grid and in other embodiments the 3D grid may be an irregular grid. The initial geophysical model may be determined, using approximate methods, from the observed geophysical dataset, from well log recorded in wellbores penetrating the subterranean region, or from simplistic assumptions, such as the assumption that density increases linearly with depth, without departing from the scope of the invention.

The initial geophysical model may contain physical parameters related to a plurality of geophysical data types. For example, the initial geophysical model may contain a seismic wave velocity model if the geophysical dataset contains seismic data, a resistivity, or a density model.

In Step 506, a current geophysical model may be determined from the initial geophysical model. The current geophysical model may initially be set to be equal to the initial geophysical model, however during the workflow depicted in flowchart (200) the current geophysical model may be updated in the light of the observed geophysical dataset to more accurately represent the true structure and physical parameters of the subterranean region.

In Step 508, using a computer processor, a trained ML network may be obtained, trained to predict the geophysical model of the subterranean region of interest from the observed geophysical dataset. The trained ML network may be obtained by determining a plurality of geophysical training models and a corresponding geophysical training dataset for each geophysical training model.

In accordance with one or more embodiments the geophysical training models may be based, at least in part, on the initial geophysical model. The training of the ML network may include finding an extremum of a training penalty function measuring the difference between each geophysical training model and the predicted geophysical training model, predicted by the ML network from the corresponding geophysical training dataset.

In accordance with one or more embodiments, the set of geophysical training models and the corresponding geophysical training datasets may be augmented with the current geophysical model and the corresponding simulated geophysical dataset and the trained ML network may be retrained based, at least in part, on the augmented set of geophysical training models and the corresponding geophysical training datasets.

In Step 510, a simulated geophysical dataset may be determined from the current geophysical model using a forward modeling method. The forward modeling method may be a physics-based forward modeling method. For example, to simulate a seismic dataset a wave equation may be solved using numerical means, such as a finite-difference or finite element method, for a geophysical model including the seismic wave velocities as a function of position. Similarly, a gravity dataset may be determined by applying Newton's gravitational law to a geophysical model containing a density as a function of subsurface position.

Furthermore, in Step 510 a data penalty function may be determined based on a difference between the observed geophysical dataset and the simulated geophysical dataset.

In Step 512, in accordance with one or more embodiments, a first model penalty function may be determine based on the current geophysical model. The first model penalty function may include a measure of a difference between the current geophysical model and a reference geophysical model. The first model penalty function may further include a measure of a second difference in a spatial variation of each of the geophysical model types. The first model penalty function may still further include a measure of a correlation between values of each of the geophysical model parameter types.

In accordance with one or more embodiments, in Step 514, a predicted geophysical model may be predicted by the trained ML network from the observed geophysical dataset. Further, a second penalty function may be determined based on a difference between the current geophysical model and the predicted geophysical model. The second model penalty function may include a measure of a difference between the current geophysical model and the predicted geophysical model. The second model penalty function may also include a measure of a difference in a spatial variation of current geophysical model and the predicted geophysical model. The second model penalty function may further include a measure of a correlation between values of current geophysical model and the predicted geophysical model.

In Step 516 a geophysical model of the subterranean region of interest may be determined. The geophysical model may be determined by forming a composite penalty function including a weighted sum of the data penalty function, the first penalty function, and the second penalty function. Further in Step 516 an extremum of the composite penalty function may be found by adjusting the geophysical parameters of the current geophysical model. In some embodiments, the extremum may be a minimum while in other embodiments the extremum may be a maximum. The adjusted geophysical model parameters that produce an extremum of the composite objective function may be used to update the current geophysical model.

The geophysical model may be used, together with other available information, to determine subterranean formations with a greater probability of containing hydrocarbons, such as gas or oil, the other neighboring subsurface formations. Further the geophysical model may be used to determine locations within these hydrocarbon bearing formations to which wellbores may be drilled, safely and economically, to produce the hydrocarbons.

Prior to the commencement of drilling a wellbore a wellbore plan may be generated. The wellbore plan may include a starting surface location of the wellbore, or a subsurface location within an existing wellbore, from which the wellbore may be drilled. Further, the wellbore plan may include a terminal location that may intersect with the targeted hydrocarbon bearing formation and a planned wellbore path from the starting location to the terminal location.

Typically, the wellbore plan is generated based on best available information from the geophysical model, geomechanical models encapsulating subterranean stress conditions, the trajectory of any existing wellbores (that must be avoided), and the existence of other drilling hazards, such as shallow gas pockets, over-pressure zones, and active fault plans. Furthermore, the wellbore plan may take into account other engineering constraints such as the maximum wellbore curvature ("dog-log") that the drillstring may tolerate and the maximum torque and drag values that the drilling system may tolerate.

A wellbore planning system may be used to generate the wellbore plan. The wellbore planning system may comprise one or more computer processors in communication with computer memory containing the geophysical and geomechanical models, information relating to drilling hazards, and the constraints imposed by the limitations of the drillstring and the drilling system. The wellbore planning system may further include dedicated software to determine the planned wellbore path and associated drilling parameters, such as the planned wellbore diameter, the location of planned changes of the wellbore diameter, the planned depths at which casing will be inserted to support the wellbore and to prevent formation fluids entering the wellbore, and the mud weights (densities) and types that may be used during drilling the wellbore.

Figure 6A:
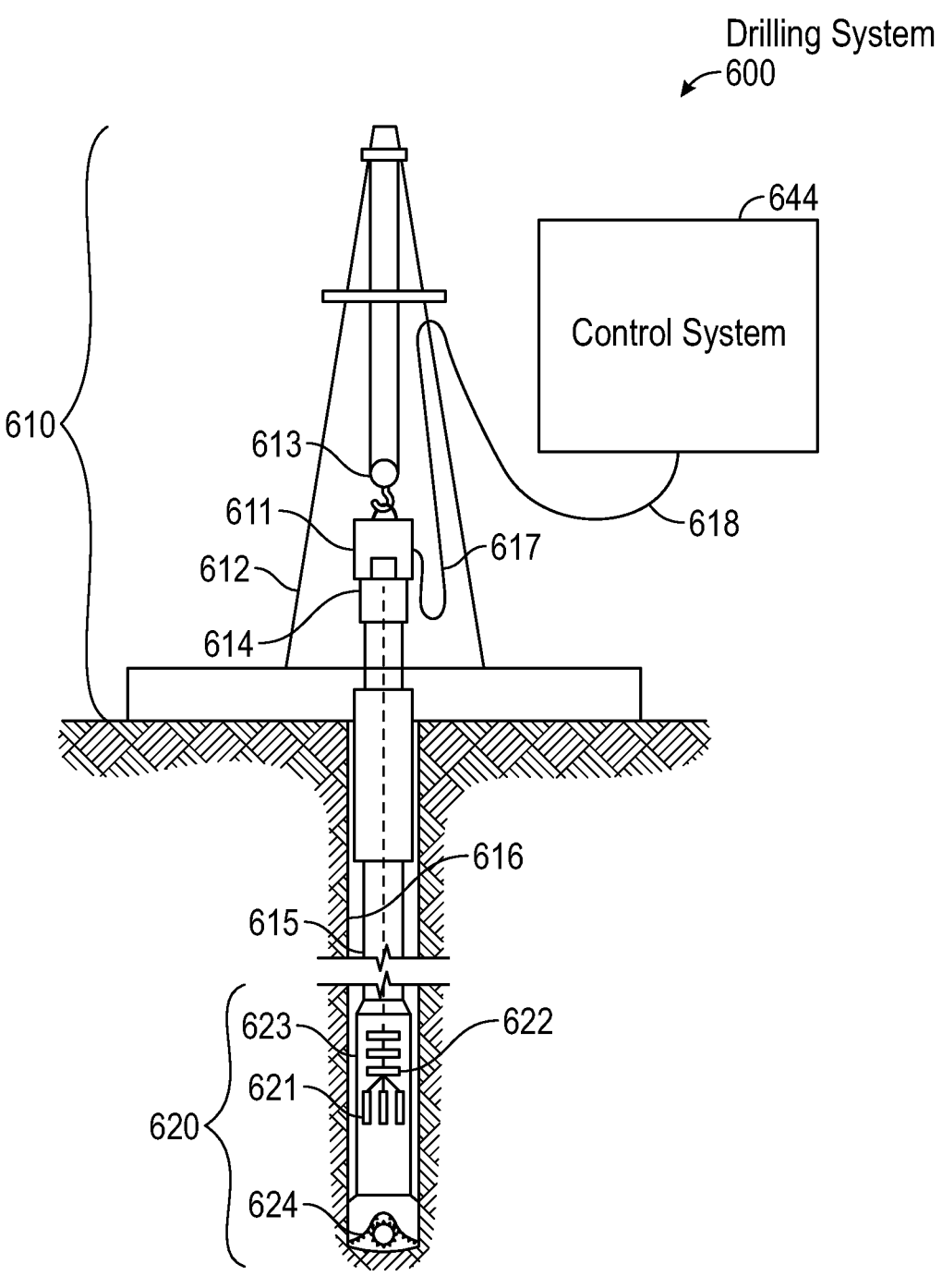
FIGS. 6A and 6B show a system in according to one or more embodiments.
Figure 6B:
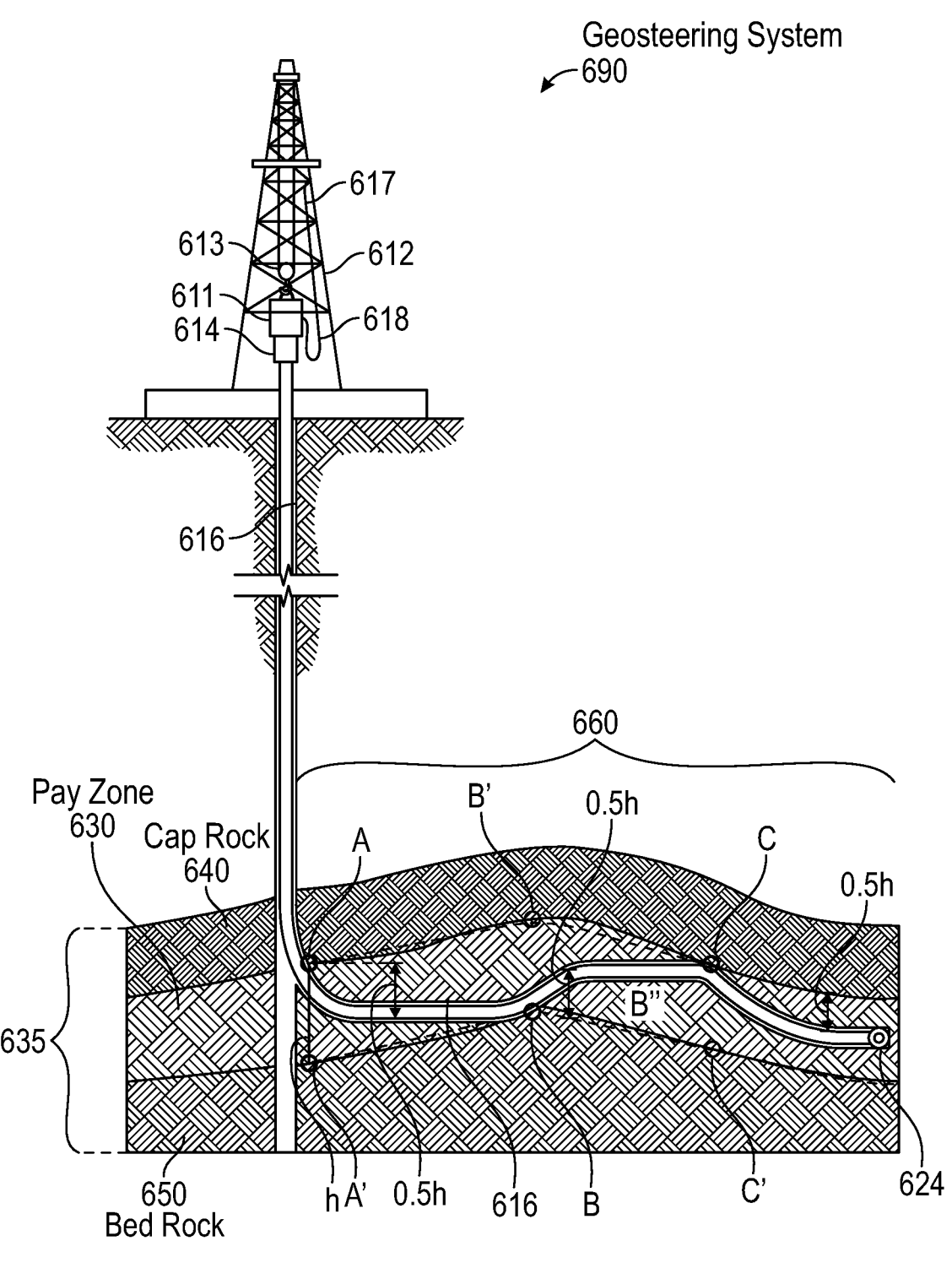

FIGS. 6A and 6B illustrate drilling systems in accordance with one or more embodiments. As shown in FIG. 6A, a drilling system (600) may include a top drive drill rig (610) arranged around the setup of a drill bit logging tool (620). A top drive drill rig (610) may include a top drive (611) that may be suspended in a derrick (612) by a travelling block (613). In the center of the top drive (611), a drive shaft (614) may be coupled to a top pipe of a drill string (615), for example, by threads. The top drive (611) may rotate the drive shaft (614), so that the drill string (615) and a drill bit logging tool (620) cut the rock at the bottom of a wellbore (616). A power cable (617) supplying electric power to the top drive (611) may be protected inside one or more service loops (618) coupled to a control system (644). As such, drilling mud may be pumped into the wellbore (616) through a mud line, the drive shaft (614), and/or the drill string (615).

Moreover, when completing a well, casing may be inserted into the wellbore (616). The sides of the wellbore (616) may require support, and thus the casing may be used for supporting the sides of the wellbore (616). As such, a space between the casing and the untreated sides of the wellbore (616) may be cemented to hold the casing in place. The cement may be forced through a lower end of the casing and into an annulus between the casing and a wall of the wellbore (616). More specifically, a cementing plug may be used for pushing the cement from the casing. For example, the cementing plug may be a rubber plug used to separate cement slurry from other fluids, reducing contamination and maintaining predictable slurry performance. A displacement fluid, such as water, or an appropriately weighted drilling mud, may be pumped into the casing above the cementing plug. This displacement fluid may be pressurized fluid that serves to urge the cementing plug downward through the casing to extrude the cement from the casing outlet and back up into the annulus.

As further shown in FIG. 6A, sensors (621) may be included in a sensor assembly (623), which is positioned adjacent to a drill bit (624) and coupled to the drill string (615). Sensors (621) may also be coupled to a processor assembly (623) that includes a processor, memory, and an analog-to-digital converter (622) for processing sensor measurements. For example, the sensors (621) may include acoustic sensors, such as accelerometers, measurement microphones, contact microphones, and hydrophones. Likewise, the sensors (621) may include other types of sensors, such as transmitters and receivers to measure resistivity, gamma ray detectors, etc. The sensors (621) may include hardware and/or software for generating different types of well logs (such as acoustic logs or density logs) that may provide well data about a wellbore, including porosity of wellbore sections, gas saturation, bed boundaries in a geologic formation, fractures in the wellbore or completion cement, and many other pieces of information about a formation. If such well data is acquired during drilling operations (i.e., logging-while-drilling), then the information may be used to make adjustments to drilling operations in real-time. Such adjustments may include rate of penetration (ROP), drilling direction, altering mud weight, and many others drilling parameters.

In some embodiments, acoustic sensors may be installed in a drilling fluid circulation system of a drilling system (600) to record acoustic drilling signals in real-time. Drilling acoustic signals may transmit through the drilling fluid to be recorded by the acoustic sensors located in the drilling fluid circulation system. The recorded drilling acoustic signals may be processed and analyzed to determine well data, such as lithological and petrophysical properties of the rock formation. This well data may be used in various applications, such as steering a drill bit using geosteering, casing shoe positioning, etc.

The control system (644) may be coupled to the sensor assembly (623) in order to perform various program functions for up-down steering and left-right steering of the drill bit (624) through the wellbore (616). More specifically, the control system (644) may include hardware and/or software with functionality for geosteering a drill bit through a formation in a lateral well using sensor signals, such as drilling acoustic signals or resistivity measurements. For example, the formation may be a hydrocarbon reservoir region, such as a pay zone, bed rock, or cap rock.

Turning to geosteering, geosteering may be used to position the drill bit (624) or drill string (615) relative to a boundary between different subsurface layers (e.g., overlying, underlying, and lateral layers of a pay zone) during drilling operations. In particular, measuring rock properties during drilling may provide the drilling system (600) with the ability to steer the drill bit (624) in the direction of desired hydrocarbon concentrations. As such, a geosteering system may use various sensors located inside or adjacent to the drilling string (615) to determine different rock formations within a wellbore's path. In some geosteering systems, drilling tools may use resistivity or acoustic measurements to guide the drill bit (624) during horizontal or lateral drilling.

Turning to FIG. 6B, FIG. 6B illustrates some embodiments for steering a drill bit through a lateral pay zone using a geosteering system (690). As shown in FIG. 6B, the geosteering system (690) may include the drilling system (600) from FIG. 6A. In particular, the geosteering system (690) may include functionality for monitoring various sensor signatures (e.g., an acoustic signature from acoustic sensors) that gradually or suddenly change as a well path traverses a cap rock (630), a pay zone (640), and a bed rock (650). Because of the sudden change in lithology between the cap rock (630) and the pay zone (640), for example, a sensor signature of the pay zone (640) may be different from the sensor signature of the cap rock (630). When the drill bit (624) drills out of the pay zone (640) into the cap rock (630), a detected amplitude spectrum of a particular sensor type may change suddenly between the two distinct sensor signatures. In contrast, when drilling from the pay zone (640) downward into the bed rock (650), the detected amplitude spectrum may gradually change.

During the lateral drilling of the wellbore (616), preliminary upper and lower boundaries of a formation layer's thickness may be derived from a geophysical survey and/or an offset well obtained before drilling the wellbore (616). If a vertical section (635) of the well is drilled, the actual upper and lower boundaries of a formation layer (i.e., actual pay zone boundaries (A, A')) and the pay zone thickness (i.e., A to A') at the vertical section (635) may be determined. Based on this well data, an operator may steer the drill bit (624) through a lateral section (660) of the wellbore (616) in real time. In particular, a logging tool may monitor a detected sensor signature proximate the drill bit (624), where the detected sensor signature may continuously be compared against prior sensor signatures, e.g., of the cap rock (630), pay zone (640), and bed rock (650), respectively. As such, if the detected sensor signature of drilled rock is the same or similar to the sensor signature of the pay zone (640), the drill bit (624) may still be drilling in the pay zone (640). In this scenario, the drill bit (624) may be operated to continue drilling along its current path and at a predetermined distance (0.5 h) from a boundary of a formation layer. If the detected sensor signature is same as or similar to the prior sensor signatures of the cap rock (630) or the bed rock (650), respectively, then the control system (644) may determine that the drill bit (624) is drilling out of the pay zone (640) and into the upper or lower boundary of the pay zone (640). At this point, the vertical position of the drill bit (624) at this lateral position within the wellbore (616) may be determined and the upper and lower boundaries of the pay zone (640) may be updated, (for example, positions B and C in FIG. 6B). In some embodiments, the vertical position at the opposite boundary may be estimated based on the predetermined thickness of the pay zone (640), such as positions B' and C'.

While FIGS. 6A, and 6B shows various configurations of components, other configurations may be used without departing from the scope of the disclosure. For example, various components in FIGS. 6A, and 6B may be combined to create a single component. As another example, the functionality performed by a single component may be performed by two or more components.

Figure 7:
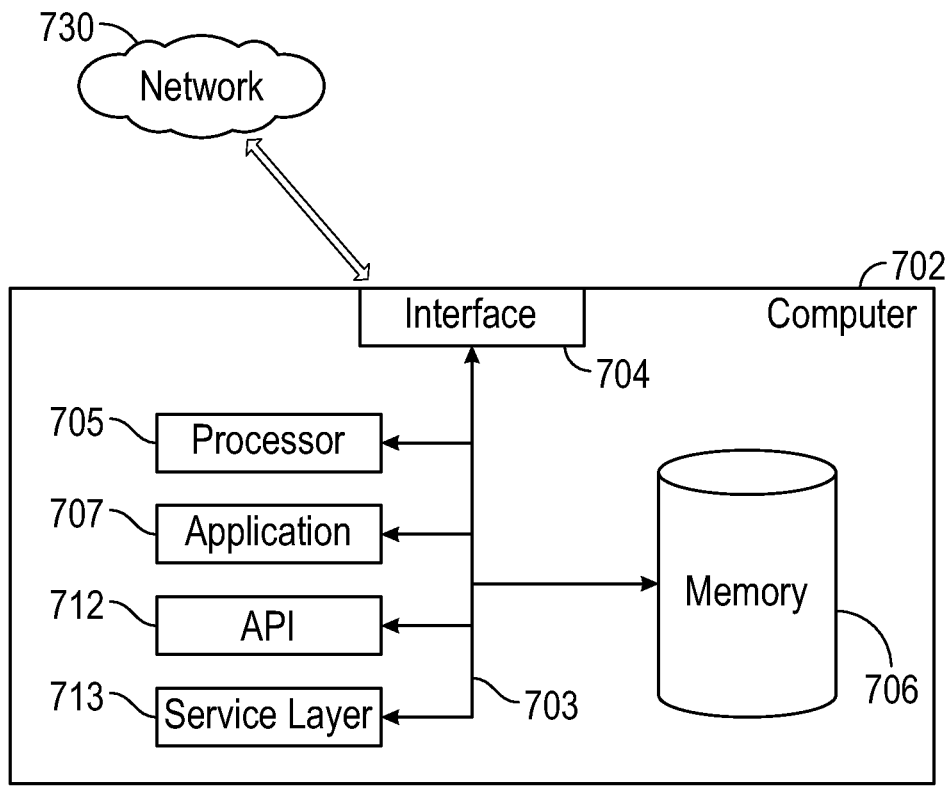
FIG. 7 shows a system in according to one or more embodiments.

FIG. 7 further depicts a block diagram of a computer system (702) used to provide computational functionalities associated with described algorithms, methods, functions, processes, flows, and procedures as described in this disclosure, according to one or more embodiments. In particular, FIG. 7 may depict a ML engine for performing the method for determining an updated geophysical model (790) for a subterranean region of interest (202).

The illustrated computer (702) is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (702) may include an input device, such as a keypad, keyboard, touch screen, or other device that can accept user information, and an output device that conveys information associated with the operation of the computer (702), including digital data, visual, or audio information (or a combination of information), or a GUI.

The computer (702) can serve in a role as a client, network component, a server, a database or other persistency, or any other component (or a combination of roles) of a computer system for performing the subject matter described in the instant disclosure. The illustrated computer (702) is communicably coupled with a network (730). In some implementations, one or more components of the computer (702) may be configured to operate within environments, including cloud-computing-based, local, global, or other environment (or a combination of environments).

At a high level, the computer (702) is an electronic computing device operable to receive, transmit, process, store, or manage data and information associated with the described subject matter. According to some implementations, the computer (702) may also include or be communicably coupled with an application server, e-mail server, web server, caching server, streaming data server, business intelligence (BI) server, or other server (or a combination of servers).

The computer (702) can receive requests over network (730) from a client application (for example, executing on another computer (702) and responding to the received requests by processing the said requests in an appropriate software application. In addition, requests may also be sent to the computer (702) from internal users (for example, from a command console or by other appropriate access method), external or third-parties, other automated applications, as well as any other appropriate entities, individuals, systems, or computers.

Each of the components of the computer (702) can communicate using a system bus (703). In some implementations, any or all of the components of the computer (702), both hardware or software (or a combination of hardware and software), may interface with each other or the interface (704) (or a combination of both) over the system bus (703) using an application programming interface (API) (712) or a service layer (713) (or a combination of the API (712) and service layer (713). The API (712) may include specifications for routines, data structures, and object classes. The API (712) may be either computer-language independent or dependent and refer to a complete interface, a single function, or even a set of APIs. The service layer (713) provides software services to the computer (702) or other components (whether or not illustrated) that are communicably coupled to the computer (702). The functionality of the computer (702) may be accessible for all service consumers using this service layer. Software services, such as those provided by the service layer (713), provide reusable, defined business functionalities through a defined interface. For example, the interface may be software written in JAVA, C++, or other suitable language providing data in extensible markup language (XML) format or another suitable format. While illustrated as an integrated component of the computer (702), alternative implementations may illustrate the API (712) or the service layer (713) as stand-alone components in relation to other components of the computer (702) or other components (whether or not illustrated) that are communicably coupled to the computer (702). Moreover, any or all parts of the API (712) or the service layer (713) may be implemented as child or sub-modules of another software module, enterprise application, or hardware module without departing from the scope of this disclosure.

The computer (702) includes an interface (704). Although illustrated as a single interface (704) in FIG. 7, two or more interfaces (704) may be used according to particular needs, desires, or particular implementations of the computer (702). The interface (704) is used by the computer (702) for communicating with other systems in a distributed environment that are connected to the network (730). Generally, the interface (704) includes logic encoded in software or hardware (or a combination of software and hardware) and operable to communicate with the network (730). More specifically, the interface (704) may include software supporting one or more communication protocols associated with communications such that the network (730) or interface's hardware is operable to communicate physical signals within and outside of the illustrated computer (702).

The computer (702) includes at least one computer processor (705). Although illustrated as a single computer processor (705) in FIG. 7, two or more processors may be used according to particular needs, desires, or particular implementations of the computer (702). Generally, the computer processor (705) executes instructions and manipulates data to perform the operations of the computer (702) and any algorithms, methods, functions, processes, flows, and procedures as described in the instant disclosure.

The computer (702) also includes a memory (706) that holds data for the computer (702) or other components (or a combination of both) that can be connected to the network (730). For example, memory (706) may be a non-transitory computer readable medium memory (706) can be a database storing data consistent with this disclosure. Although illustrated as a single memory (706) in FIG. 7, two or more memories (706) may be used according to particular needs, desires, or particular implementations of the computer (702) and the described functionality. While memory (706) is illustrated as an integral component of the computer (702), in alternative implementations, memory (706) can be external to the computer (702).

The application (707) is an algorithmic software engine providing functionality according to particular needs, desires, or particular implementations of the computer (702), particularly with respect to functionality described in this disclosure. For example, application (707) can serve as one or more components, modules, applications, etc. Further, although illustrated as a single application (707), the application (707) may be implemented as multiple applications (707) on the computer (702). In addition, although illustrated as integral to the computer (702), in alternative implementations, the application (707) can be external to the computer (702).

There may be any number of computers (702) associated with, or external to, a computer system containing a computer (702), wherein each computer (702) communicates over network (730). Further, the term "client," "user," and other appropriate terminology may be used interchangeably as appropriate without departing from the scope of this disclosure. Moreover, this disclosure contemplates that many users may use one computer (702), or that one user may use multiple computers (702).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed:

1. A method for determining a geophysical model of a subterranean region, comprising:
   obtaining an observed geophysical dataset from the subterranean region;
   obtaining a current geophysical model for the subterranean region;
   executing, by a computer processor, a training procedure that iteratively updates parameters of a deep learning neural network using a plurality of geophysical training models and a corresponding geophysical training dataset for each geophysical training model to produce a trained machine learning (ML) network configured to generate a predicted geophysical model;
   generating, by the trained ML network executed on the computer processor, the predicted geophysical model from the observed geophysical dataset;
   iteratively, until a convergence criterion is satisfied, performing steps comprising:
      simulating, by a forward modeling method executed on the computer processor, a simulated geophysical dataset from the current geophysical model;
      generating, using the computer processor, a data penalty function based on a difference between the observed geophysical dataset and the simulated geophysical dataset;
      generating, using the computer processor, a first model penalty function based on the current geophysical model;
      generating, using the computer processor, a second model penalty function based on a difference between the current geophysical model and the predicted geophysical model;
      generating, using the computer processor, a composite penalty function based, at least in part, on a weighted sum of the data penalty function, the first model penalty function, and the second model penalty function;
      generating, using the computer processor, an updated geophysical model based, at least in part, on finding an extremum of the composite penalty function; and
      replacing the current geophysical model with the updated geophysical model;
   wherein the geophysical model of the subterranean region is the updated geophysical model obtained upon satisfaction of the convergence criterion.

2. The method of claim 1, further comprising:
   determining a location of a hydrocarbon reservoir based, at least in part, on the geophysical model; and
   planning, using a wellbore planning system, a planned wellbore path to intersect the hydrocarbon reservoir.

3. The method of claim 2, further comprising drilling a wellbore guided by the planned wellbore path using a drilling system.

4. The method of claim 1, wherein executing the training procedure comprises:
   determining the plurality of geophysical training models and the corresponding geophysical training dataset for each geophysical training model based, at least in part, on the current geophysical model; and
   training the ML network based, at least in part, on finding an extremum of a training penalty function measuring a difference between each geophysical training model and a corresponding predicted geophysical training model.

5. The method of claim 4, wherein executing the training procedure further comprises:
   augmenting the plurality of geophysical training models and the corresponding geophysical training datasets with the current geophysical model and the simulated geophysical dataset for the current geophysical model; and
   retraining the trained ML network based, at least in part, on the augmented plurality of geophysical training models and the corresponding geophysical training datasets.

6. The method of claim 1, wherein the current geophysical model and the training geophysical models each comprises a plurality of geophysical model types selected from a seismic model, a density model, and a resistivity model.

7. The method of claim 6, wherein the first model penalty function comprises:
   a measure of a first difference between the current geophysical model and a reference geophysical model;
   a measure of a second difference between a spatial variation of each of the geophysical model types; and
   a measure of a first correlation between values of each of the geophysical model types.

8. The method of claim 1, wherein the second model penalty function comprises:
   a measure of a third difference between the current geophysical model and the predicted geophysical model predicted by the trained ML network;
   a measure of a fourth difference between a spatial variation of the current geophysical model and a spatial variation of the predicted geophysical model; and a measure of a second correlation between values of the current geophysical model and the predicted geophysical model.

9. The method of claim 1, wherein the extremum comprises a minimum.

10. The method of claim 1, wherein the forward modeling method comprises a physics-based forward modeling method.

11. A non-transitory computer readable medium, storing instructions executable by a computer processor, the instructions comprising functionality for:

receiving an observed geophysical dataset from a subterranean region;

receiving a current geophysical model for the subterranean region;

executing a training procedure that iteratively updates parameters of a deep learning neural network using a plurality of geophysical training models and a corresponding geophysical training dataset for each geophysical training model to produce a trained machine learning (ML) network configured to generate a predicted geophysical model;

generating, by the trained ML network executed on the computer processor, the predicted geophysical model from the observed geophysical dataset;

iteratively, until a convergence criterion is satisfied, performing steps comprising simulating, by a forward modeling method executed on the computer processor, a simulated geophysical dataset from the current geophysical model;

generating a data penalty function based on a difference between the observed geophysical dataset and the simulated geophysical dataset;

generating a first model penalty function based on the current geophysical model;

generating a second model penalty function based on a difference between the current geophysical model and the predicted geophysical model;

generating a composite penalty function based, at least in part, on a weighted sum of the data penalty function, the first model penalty function, and the second model penalty function;

generating an updated geophysical model based, at least in part, on finding an extremum of the composite penalty function; and replacing the current geophysical model with the updated geophysical model;

wherein a geophysical model of the subterranean region is the updated geophysical model obtained upon satisfaction of the convergence criterion.

12. The non-transitory computer readable medium of claim 11, the instructions further comprising the functionality for:

determining a location of a hydrocarbon reservoir based, at least in part, on the geophysical model; and planning, using a wellbore planning system, a wellbore path to intersect the hydrocarbon reservoir.

13. The non-transitory computer readable medium of claim 11, the instructions further comprising the functionality for:

determining the plurality of geophysical training models and the corresponding geophysical training dataset for each geophysical training model based, at least in part, on the current geophysical model of the subterranean region; and training the ML network based, at least in part, on finding an extremum of a training penalty function measuring the difference between each geophysical training model and a corresponding predicted geophysical training model.

14. The non-transitory computer readable medium of claim 13, the instructions further comprising the functionality for:

augmenting the plurality of geophysical training models and the corresponding geophysical training datasets with the current geophysical model and the simulated geophysical dataset for the current geophysical model; and retraining the trained ML network based, at least in part, on the augmented plurality of geophysical training models and the corresponding geophysical training datasets.

15. The non-transitory computer readable medium of claim 11, wherein the current geophysical model and the training geophysical models each comprises a plurality of geophysical model types selected from a seismic model, a density model, and a resistivity model.

16. The non-transitory computer readable medium of claim 15, wherein the first model penalty function comprises:

a measure of a first difference between the current geophysical model and a reference geophysical model;

a measure of a second difference between a spatial variation of each of the geophysical model types; and a measure of a first correlation between values of each of the geophysical model types.

17. The non-transitory computer readable medium of claim 11, wherein the second model penalty function comprises:

a measure of a third difference between the current geophysical model and the predicted geophysical model predicted by the trained ML network;

a measure of a fourth difference between a spatial variation of current geophysical model and a spatial variation of the predicted geophysical model; and a measure of a second correlation between values of current geophysical model and the predicted geophysical model.

18. The non-transitory computer readable medium of claim 11, wherein the extremum comprises a minimum.

19. A system, comprising:

a computer system, configured to:

receive an observed geophysical dataset from a subterranean region, receive a current geophysical model for the subterranean region, execute a training procedure that iteratively updates parameters of a deep learning neural network using a plurality of geophysical training models and a corresponding geophysical training dataset for each geophysical training model to produce a trained machine learning (ML) network configured to generate a predicted geophysical model;

generate, by the trained ML network, the predicted geophysical model from the observed geophysical dataset;

iteratively, until a convergence criterion is satisfied, perform steps comprising:

simulate, by a forward modeling method, a simulated geophysical dataset from the current geophysical model, generate a data penalty function based on a difference between the observed geophysical dataset and the simulated geophysical dataset, generate a first model penalty function based on the current geophysical model, generate a second model penalty function based on a difference between the current geophysical model and the predicted geophysical model, generate a composite penalty function based, at least in part, on a weighted sum of the data penalty function, the first model penalty function, and the second model penalty function, generate an updated geophysical model based, at least in part, on finding an extremum of the composite penalty function, and replace the current geophysical model with the updated geophysical model, wherein a geophysical model of the subterranean region is the updated geophysical model obtained upon satisfaction of the convergence criterion; and generate a location of a hydrocarbon reservoir based, at least in part, on the geophysical model of the subterranean region; and a wellbore planning system configured to plan a planned wellbore path to intersect the location of the hydrocarbon reservoir.

20. The system of claim 19, further comprising a drilling system to drill a wellbore guided by the planned wellbore path.

* * * * *